United States Patent
Jeong et al.

(10) Patent No.: US 9,024,333 B2
(45) Date of Patent: May 5, 2015

(54) LIGHT EMITTING DEVICE

(75) Inventors: Jongpil Jeong, Seoul (KR); Sanghyun Lee, Seoul (KR); Sehwan Sim, Seoul (KR); Sungyi Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 33 days.

(21) Appl. No.: 13/359,117

(22) Filed: Jan. 26, 2012

(65) Prior Publication Data

US 2012/0187370 A1    Jul. 26, 2012

(30) Foreign Application Priority Data

Jan. 26, 2011   (KR) .................. 10-2011-0007926

(51) Int. Cl.
| | |
|---|---|
| *H01L 33/22* | (2010.01) |
| *H01L 33/20* | (2010.01) |
| *H01L 33/04* | (2010.01) |
| *H01L 33/12* | (2010.01) |
| *H01L 33/14* | (2010.01) |

(52) U.S. Cl.
CPC ................. *H01L 33/20* (2013.01); *H01L 33/04* (2013.01); *H01L 33/12* (2013.01); *H01L 33/14* (2013.01); *H01L 33/22* (2013.01); *H01L 2924/0002* (2013.01); *H01L 2224/48091* (2013.01)

(58) Field of Classification Search
USPC .................................. 257/13–15; 438/22, 29
See application file for complete search history.

(56) References Cited

U.S. PATENT DOCUMENTS

| | | | | |
|---|---|---|---|---|
| 6,316,785 | B1 * | 11/2001 | Nunoue et al. .................. | 257/14 |
| 7,504,667 | B2 * | 3/2009 | Fujikura et al. ................. | 257/98 |
| 7,615,804 | B2 * | 11/2009 | Nagahama et al. ............ | 257/190 |
| 7,824,937 | B2 * | 11/2010 | Suehiro et al. .................. | 438/26 |
| 7,858,418 | B2 * | 12/2010 | Watanabe et al. ............... | 438/46 |
| 2007/0241352 | A1 * | 10/2007 | Yasuda et al. ................... | 257/94 |
| 2010/0155704 | A1 * | 6/2010 | Oh et al. ......................... | 257/28 |

* cited by examiner

*Primary Examiner* — Fernando L Toledo
*Assistant Examiner* — Bryan Junge
(74) *Attorney, Agent, or Firm* — Ked & Associates, LLP

(57) ABSTRACT

Disclosed is a light emitting device including a substrate, a first conductive semiconductor layer disposed on the substrate, an active layer disposed on the first conductive semiconductor layer, and a second conductive semiconductor layer disposed on the active layer, wherein the first conductive semiconductor layer comprises a first layer provided at the upper surface thereof with a notch, a second layer disposed on the first layer and a third layer disposed on the second layer, wherein the first conductive semiconductor layer further comprises a blocking layer between the first layer and the second layer and the blocking layer is disposed along the notch. The light emitting device can reduce leakage current by dislocation and improve resistance to static electricity.

17 Claims, 8 Drawing Sheets

LIGHT EMITTING DEVICE

CROSS-REFERENCE TO RELATED APPLICATION

This application claims the priority benefit of Korean Patent Application No. 10-2011-0007926, filed on Jan. 26, 2011 in the Korean Intellectual Property Office, the disclosure of which is incorporated herein by reference.

BACKGROUND

1. Field

Embodiments relate to a light emitting device.

2. Description of the Related Art

A light emitting device (LED) is a device which converts an electrical signal into infrared ray, ultraviolet ray or light using characteristics of compound semiconductors. LEDs are now being applied to devices such as home appliances, remote controls, electronic signboards, displays, a variety of automatic appliances and the like and the application range thereof continues to expand.

Generally, a miniaturized LED is fabricated as a surface mount device such that it can be directly mounted to a printed circuit board (PCB) substrate. Accordingly, an LED lamp used as a display device is also developed as a surface mount device. Such a surface mount device may replace a conventional lamp and is used as a lighting display, a character display, an image display or the like, rendering various colors.

Meanwhile, in the light emitting device, great crystal defects such as dislocation occur on the semiconductor layer due to great lattice mismatch between the substrate and the semiconductor layer. Such crystal defects increase leakage current of the light emitting device and the active layer of the light emitting device may be broken by strong field when exterior static electricity is applied. Accordingly, in order to apply the light emitting device to lighting devices, a predetermined level or higher of resistance to electrostatic discharge (ESD) is required.

SUMMARY

Therefore, the embodiments have been made in view of the above problems, and it is an object of the embodiments to provide a light emitting device which is resistant to electrostatic discharge (ESD).

In accordance with one aspect, provided is a light emitting device including: a substrate; a first conductive semiconductor layer disposed on the substrate; an active layer disposed on the first conductive semiconductor layer; and a second conductive semiconductor layer disposed on the active layer, wherein the first conductive semiconductor layer comprises a first layer provided at the upper surface thereof with a notch, a second layer disposed on the first layer and a third layer disposed on the second layer, wherein the first conductive semiconductor layer further includes a blocking layer between the first layer and the second layer and the blocking layer is disposed along the notch.

In addition, the first conductive semiconductor layer may include a blocking layer between a first layer provided with a notch and a second layer.

BRIEF DESCRIPTION OF THE DRAWINGS

The above and other objects, features and other advantages of embodiments will be more clearly understood from the following detailed description taken in conjunction with the accompanying drawings, in which.

DETAILED DESCRIPTION OF THE PREFERRED EMBODIMENTS

Figure 1:
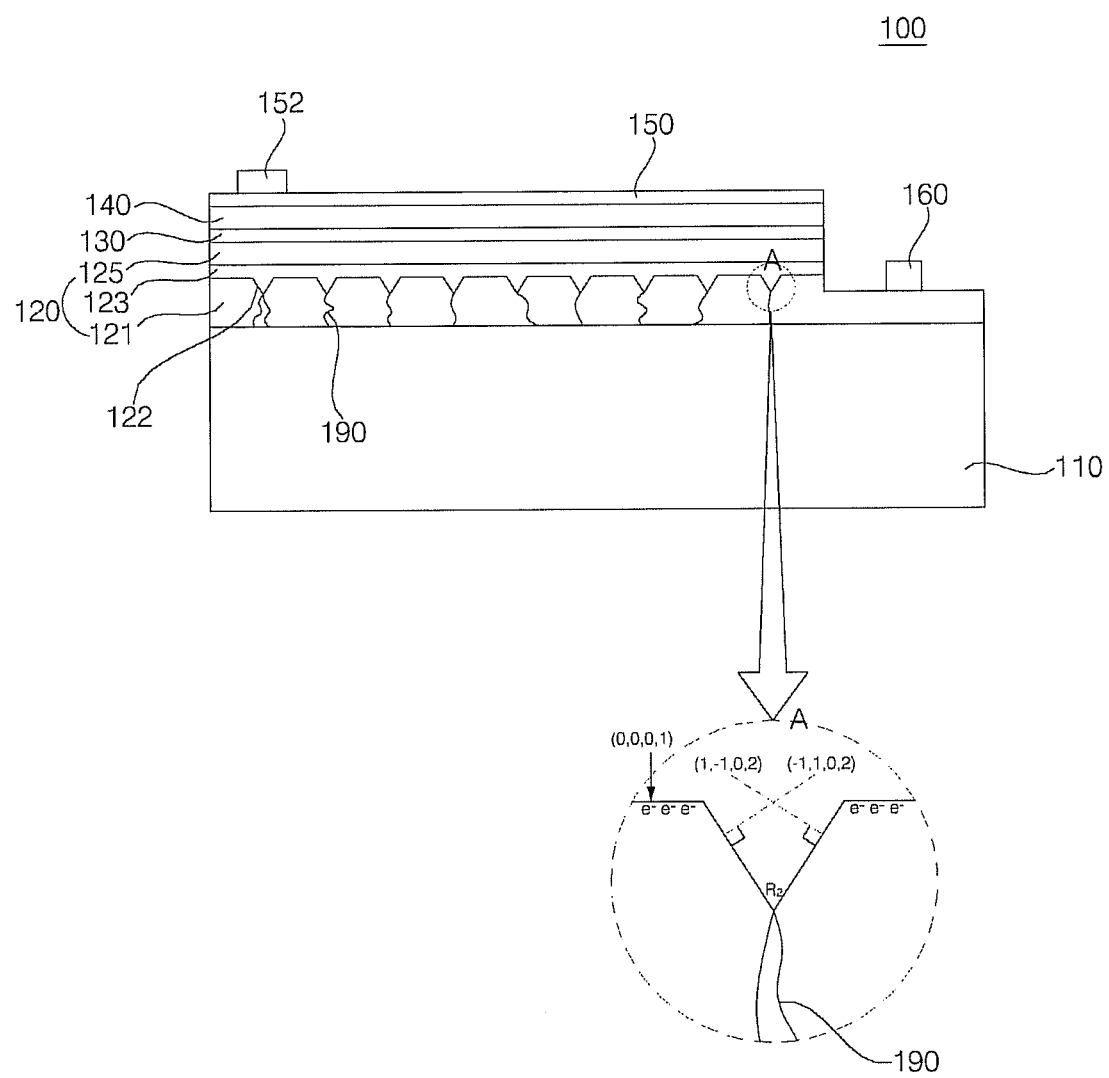
FIG. 1 is a cross-sectional view illustrating a light emitting device according to one embodiment.

Reference will now be made in detail to the preferred embodiments, examples of which are illustrated in the accompanying drawings.

Advantages and characteristics of the embodiments and methods for addressing the same will be clearly understood from the following embodiments taken in conjunction with the annexed drawings. However, the embodiments are not limited to the embodiments and may be realized in various other forms. The embodiments are provided only to more completely illustrate the embodiments and to allow a person having ordinary skill in the art to fully understand the scope of the embodiments. The scope of the embodiments is defined only by the claims. Accordingly, in some embodiments, well-known processes, well-known device structures and well-known techniques are not illustrated in detail to avoid unclear interpretation of the embodiments. The same reference numbers will be used throughout the specification to refer to the same or like parts.

Spatially relative terms, "below", "beneath", "lower", "above", "upper" and the like may be used to indicate the relationship between one device or constituent elements and other devices or constituent elements, as shown in the drawings. It should be understood that spatially relative terms include the direction illustrated in the drawings as well as other directions of devices during use or operation. For example, in a case in which the device shown in the drawing is reversed, a device disposed "below" or "beneath" the other device may be disposed "above" the other device. Accordingly, the exemplary term, "beneath" may include "below" or "beneath" and "above". The device may be disposed in other directions. As a result, the spatially relative terms may be construed depending on orientation.

Figure 2:
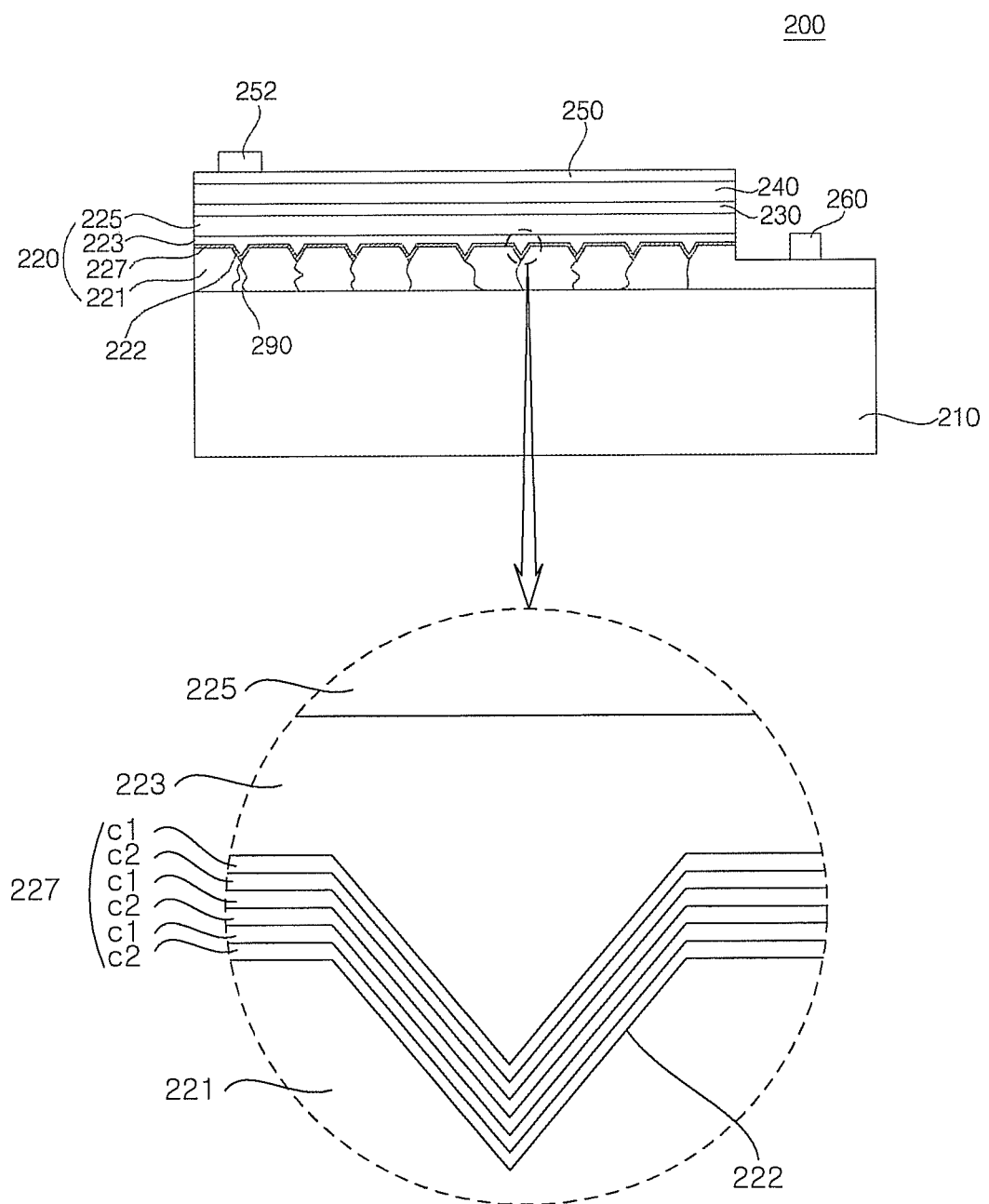
FIG. 2 is a cross-sectional view illustrating a light emitting device according to one embodiment.

FIG. 1 is a sectional view illustrating a light emitting device according to one embodiment. FIG. 2 is a cross-sectional view of the light emitting device of FIG. 1.

Referring to FIGS. 1 and 2, the light emitting device 100 includes a substrate 110, a first conductive semiconductor layer 120 disposed on the substrate 110, an active layer 130 disposed on the first conductive semiconductor layer 120 and a second semiconductor layer 140 disposed on the active layer 130, and the first conductive semiconductor layer 120 may include a first layer 121, a second layer 123 and a third layer 125.

The substrate 110 may be made of a light-transmitting material such as sapphire ($Al_2O_3$), GaN, ZnO, and AlO, without being limited thereto. In addition, the substrate 110 may be a SiC substrate having higher thermal conductivity than a sapphire $Al_2O_3$ substrate.

A buffer layer (not shown) may be disposed on the substrate 110 to reduce lattice mismatch between the substrate 110 and the first semiconductor layer 120. A buffer layer (not shown) may be grown in the form of a single crystal on the substrate 110 and the buffer layer grown in the form of a single crystal improves crystallinity of the first semiconductor layer 120 grown on the buffer layer (not shown).

The buffer layer (not shown) may be selected from semiconductor materials having a formula of $In_xAl_yGa_{1-x-y}N$ ($0 \leq x \leq 1$, $0 \leq y \leq 1$, $0 \leq x+y \leq 1$) such as GaN, InN, AlN, AlInN, InGaN, AlGaN, and InAlGaN.

The first semiconductor layer 120 is realized as an n-type semiconductor layer and supplies electrons to the active layer 140. The first conductive semiconductor layer 120 may be selected from semiconductor materials having a formula of $In_xAl_yGa_{1-x-y}N$ ($0 \leq x \leq 1$, $0 \leq y \leq 1$, $0 \leq x+y \leq 1$), such as GaN, AlN, AlGaN, InGaN, InN, InAlGaN and AlInN and may be doped with an n-type dopant such as Si, Ge and Sn.

Meanwhile, the first conductive layer 120 may include the first layer 121, the second layer 123 and the third layer 125, and the first layer 121 may be provided at the top thereof with a notch 122.

The first layer 121 may be doped with an n-type dopant and the notch 122 may be formed by control of temperature while the first layer 121 is grown. That is, when the first layer 121 is grown at a temperature of 550 to 940° C. and at a pressure of 100 to 500 Torr, the notch 122 can be imparted to the top of the first layer 121.

Meanwhile, the first conductive semiconductor layer 120 is grown from a semiconductor material having a formula of $In_xAl_yGa_{1-x-y}N$ ($0 \leq x \leq 1$, $0 \leq y \leq 1$, $0 \leq x+y \leq 1$), as shown in FIG. 1, the notch 122 may have a triangular cross-sectional shape formed by two inclined planes, that is, a first inclined plane (1,−1,0,2) and a second inclined plane (−1,1,0,2), whose cross-section is connected to the growth plane (0,0,0,1) of the first layer 121 and may have a hexagonal plane shape. That is, the notch 122 may have a wedge or hexagonal pyramid shape.

Such a notch 122 is selectively formed in a region where the dislocation 190 is formed and the notch 122 can increase resistance of the region where the dislocation 190 is formed, since a resistance ($R_2$) of an angular point is higher than a resistance ($R_1$) of the growth plane (0,0,0,1) in the first layer 121. Accordingly, when static electricity is applied, current concentrated through the dislocation 190 is blocked and leakage current by the dislocation 190 is decreased. The ESD resistance of the light emitting device 100 can be improved. At this time, current may be moved through the growth plane (0,0,0,1) of the first layer 121 with low resistance and superior crystallinity.

The second layer 123 may be an un-doped layer not doped with impurities and is for example disposed to a thickness of 4000 Å at a temperature of about 1070° C. and a pressure of about 200 Torr. The second layer 123 is grown at a temperature higher than a growth temperature of the first layer 121, thus filling the notch 122 and having a surface, the top of which is even. Accordingly, the third layer 125 disposed on the second layer 123, doped with impurities and having superior crystallinity, can be formed. In addition, the second layer 123 may include a silicon(Si). The second layer 123 may be present in plural. When the silicon(Si) is present, the resistance of the second layer 123 can be reduced and efficiency of the light emitting device 100 can thus be improved.

Similar to the first layer 121, the third layer 125 may be a layer doped with an n-type dopant and be formed to a thickness of about 1,000 Å. Taking into consideration efficiency and manufacture process of the light emitting device 100, a total thickness of the second layer 123 and the third layer 125 is preferably 1 µm or less.

The active layer 130 is a region where electrons recombine with holes and shifts to a low energy level through recombination of electrons and holes, which produces light having a wavelength corresponding to change in energy level.

The active layer 130 is for example made of a semiconductor material having a formula of $In_xAl_yGa_{1-x-y}N$ ($0 \leq x \leq 1$, $0 \leq y \leq 1$, $0 \leq x+y \leq 1$) and may have a mono-quantum well or a multi-quantum well (MQW). Accordingly, more electrons are accumulated to a low energy level of the quantum well layer. As a result, recombination probability of electrons and holes is increased and luminous efficacy can thus be improved. In addition, the active layer 130 may include a quantum wire structure or a quantum dot structure.

The second conductive semiconductor layer 140 may be realized as a p-type semiconductor layer by doping a p-type dopant such as Mg, Zn, Ca, Sr or Ba and may inject holes to the active layer 130. The second conductive semiconductor layer 140 is, for example, made of a semiconductor material having a formula of $In_xAl_yGa_{1-x-y}N$ ($0 \leq x \leq 1$, $0 \leq y \leq 1$, $0 \leq x+y \leq 1$), selected from GaN, AlN, AlGaN, InGaN, InN, InAlGaN, AlInN and the like.

Meanwhile, an intermediate layer (not shown) may be disposed between the active layer 130 and the second conductive semiconductor layer 140 and may be an electron blocking layer that prevents a phenomenon in which electrons transported from the first conductive semiconductor layer 120 to the active layer 130 are not recombined in the active layer 130 and are injected into the second conductive semiconductor layer 140 when a high current is applied.

The intermediate layer has a larger band gap than the active layer 130, thereby preventing a phenomenon in which electrons injected from the first conductive semiconductor layer 120 are not recombined in the active layer 130 and are injected into the second conductive semiconductor layer 140. As a result, probability of recombination between electrons and holes in the active layer 130 is improved and leakage current can thus be prevented.

Meanwhile, the intermediate layer may have a higher band gap than the barrier layer included in the active layer 130 and may be a p-type semiconductor layer containing Al such as AlGaN, and the type of the intermediate layer is not limited thereto.

The first conductive semiconductor layer 120, the active layer 130 and the second conductive semiconductor layer 140 may be formed by a method such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) or the like and the method is not limited thereto.

In addition, a third conductive semiconductor layer (not shown) including an n-type or p-type semiconductor layer may be disposed on the second conductive semiconductor layer 140 and, as a result, the light emitting device 100 may have at least one of np, pn, npn and pnp junctions.

In addition, the concentration of the conductive dopant doped into the first conductive semiconductor layer 120 and the second conductive semiconductor layer 140 may be uniform or non-uniform. That is, the structure of a plurality of semiconductor layers may be diversified and is not limited.

The active layer 130 and the second conductive semiconductor layer 140 are partially removed to expose a part of the first conductive semiconductor layer 120, and a first electrode 160 made of titanium (Ti) or the like may be disposed on the upper surface of the exposed first conductive semiconductor layer 120.

In addition, a light-transmitting electrode layer 150 is disposed on the second conductive semiconductor layer 140 and a second electrode 152 made of nickel (Ni) or the like may be disposed on one outer surface of the light-transmitting electrode layer 150.

The light-transmitting electrode layer 150 may be made of at least one of ITO, IZO(In—ZnO), GZO(Ga—ZnO), AZO (Al—ZnO), AGZO(Al—Ga ZnO), IGZO(In—Ga ZnO), IrOx, RuOx, RuOx/ITO, Ni/IrOx/Au and Ni/IrOx/Au/ITO and is disposed over the entire outer surface of the second conductive semiconductor layer 140, thereby preventing current crowding.

Referring to FIG. 2, the light emitting device 200 according to one embodiment includes a substrate 210, a first conductive semiconductor layer 220 disposed on the substrate 210, an active layer 230 disposed on the first conductive semiconductor layer 220 and a second semiconductor layer 240 disposed on the active layer 230, and the first conductive semiconductor layer 220 may include a first layer 221 provided with a notch 222, a second layer 223 and a third layer 225.

In addition, a part of the first conductive semiconductor layer 220 is exposed, a first electrode 260 is disposed in the exposed part, and a light-transmitting electrode layer 250 and a second electrode 252 may be disposed on the second conductive semiconductor layer 240.

Referring to FIG. 2, the light emitting device 200 according to the embodiment may include a blocking layer 227 interposed between the first layer 221 including a notch 222 and the second layer 223.

The blocking layer 227 maintains the shape of the notch 222 in the process of forming the second layer 223, contains at least one of AlN, AlGaN and InGaN and is formed to a thickness of 10 Å to 1,000 Å.

The blocking layer 227 may include at least one of AlGaN c1 and GaN c2.

Then, the blocking layer 227 may has a superlattice structure formed by laminating at least one pair of AlGaN c1 and GaN c2.

The AlGaN c1 may have an Al content of 10% to 20%. And a thickness of the AlGaN c1 may be 5 Å to 100 Å.

The GaN c2 may be doping a silicon(Si). And a thickness of the GaN c1 may be 5 Å to 200 Å.

In addition, the blocking layer 227 may be an AlGaN/GaN superlattice layer. When the blocking layer 227 has a superlattice layer structure, it prevents the dislocation 290 from being transferred to the active layer 230, thereby improving crystallinity of the active layer 230 and thus luminous efficacy of the light emitting device 200.

Figure 3:
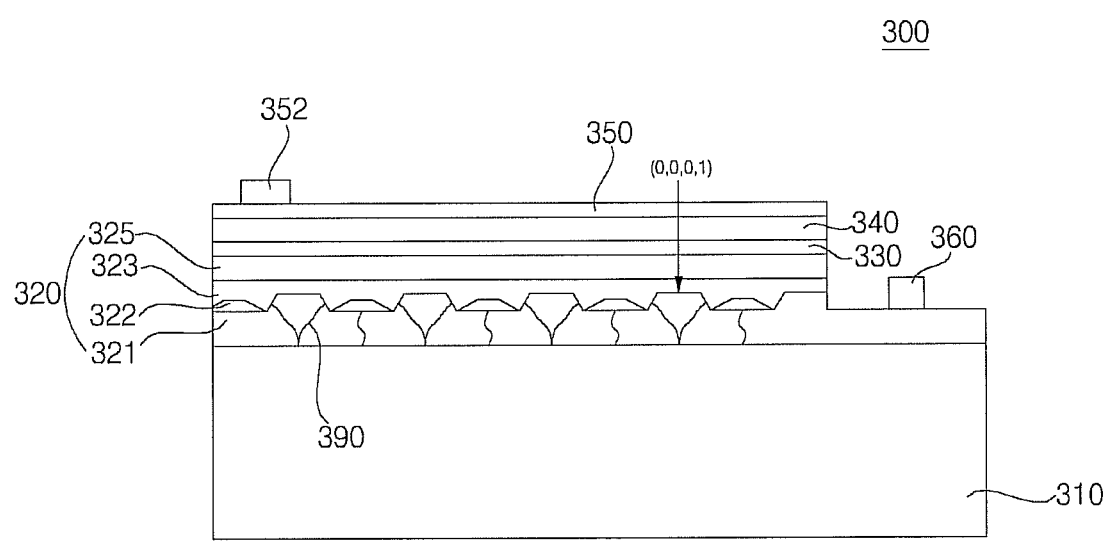
FIG. 3 is a cross-sectional view illustrating a light emitting device according to another embodiment.

FIG. 3 is a cross-sectional view of the light emitting device according to another embodiment.

Referring to FIG. 3, a light emitting device 300 according to this embodiment includes a substrate 310, a first conductive semiconductor layer 320 disposed on the substrate 310, an active layer 330 disposed on the first conductive semiconductor layer 320 and a second conductive semiconductor layer 340 disposed on the active layer 330. A part of the first conductive semiconductor layer 320 is exposed, a first electrode 360 is disposed in the exposed part and a light-transmitting electrode layer 350 and a second electrode 352 are disposed on the second conductive semiconductor layer 340.

The substrate 310, the first conductive semiconductor layer 320, the active layer 330, the second conductive semiconductor layer 340, the first electrode 360, the light-transmitting electrode layer 350 and the second electrode 352 are the same as mentioned in FIG. 1 and a detailed description thereof is thus omitted.

Referring to FIG. 3, the first layer 321 may be provided at the surface thereof with a plurality of islands 322. The islands 322 may contain one of MgN, SiN and ZnN.

For example, when the first conductive semiconductor layer 320 is made of GaN and the islands 322 are made of MgN, formation of the islands 322 can be carried out by stopping supply of a Ga (TMGa) source and supplying a Mg(CP$_2$Mg) source together with NH$_3$. The islands 322 can be formed at a temperature of 900 to 1050° C. and a pressure 100 to 500 Torr and the formed islands 322 may be disposed at a portion of the first layer 321.

When the first layer 321 is grown immediately after the islands 322 are formed, since seeds are absent on the islands 322, a high-temperature first layer 321 is not grown and the first layer 321 is grown between the adjacent islands 322.

That is, the first layer 321 extends between two adjacent islands 322 among the plurality of islands 322 and, when seen from the plane, the islands 322 surround the first layer 321.

Meanwhile, when the first layer 321 is grown, the first layer 321 is grown in the form of a column having an inclined plane and a dislocation 390 moves to the inclined plane of the first layer 321, the growth plane (0,0,0,1) of the first layer 321 has high-quality crystallinity due to decreased dislocation and thus has decreased resistance.

Accordingly, when static electricity is applied, current concentrated through the dislocation 390 is blocked and ESD resistance of the light emitting device 300 can thus be improved. At this time, current may move through the growth plane (0,0,0,1) of the first layer 321 having low resistance and superior crystallinity.

The second layer 323 may be an un-doped layer not doped with impurities and have a surface, the top of which is even.

Accordingly, the second layer 323 may be disposed on the second layer 323 and the third layer 325 doped with impurities and having superior crystallinity can be formed.

In addition, the second layer 323 includes a silicon(Si), thus decreasing resistance of the second layer 323 and improving efficiency of the light emitting device 300.

The third layer 325 may be a layer doped with an n-type dopant and may be formed to a thickness of about 1,000 Å. As mentioned in FIG. 1, taking into consideration efficiency and manufacture process of the light emitting device 300, a total thickness of the second layer 323 and the third layer 325 is preferably 1 μm or less.

Figure 4:
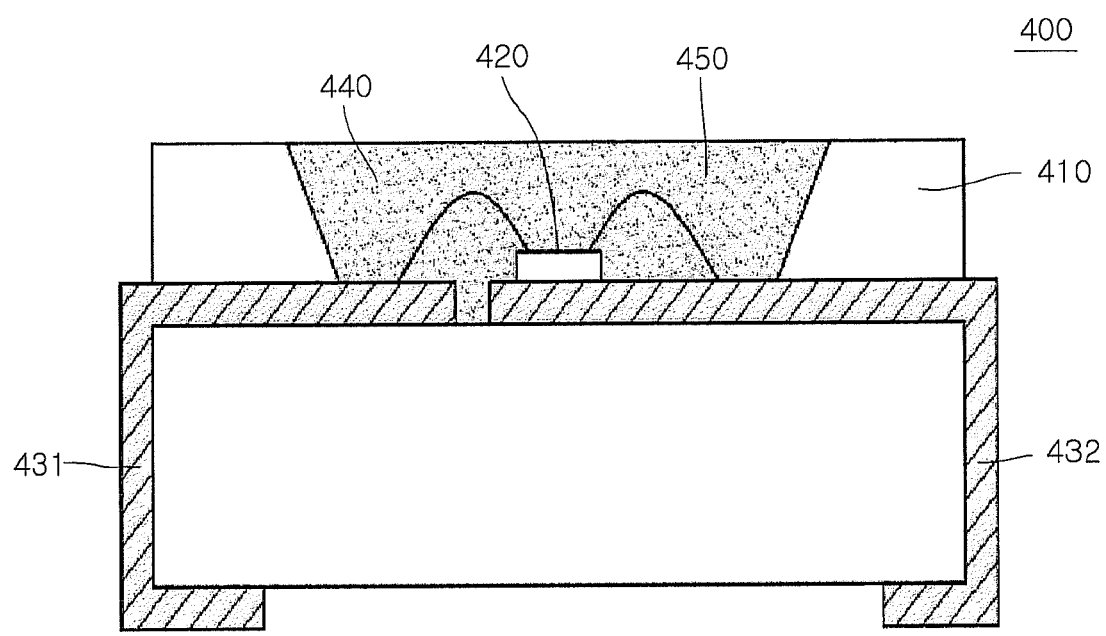
FIG. 4 is a cross-sectional view illustrating a light emitting device package according to another embodiment.

FIG. 4 is a cross-sectional view illustrating a light emitting device package according to another embodiment.

Referring to FIG. 4, a light emitting device package 400 may include a body 410 forming a cavity, a first electrode layer 431 and a second electrode layer 432 mounted on the body 410, a light emitting device 420 electrically connected to the first electrode layer 431 and a sealant 440 filling the second electrode layer 432.

The body 410 may be made of at least one selected from resins such as polyphthalamide (PPA), silicon (Si), aluminum (Al), aluminum nitride (AlN), aluminum oxide (AlOx), photosensitive glass (PSG), polyamide 9T (PA9T), syndiotactic polystyrene (SPS), a metal, sapphire (Al$_2$O$_3$), beryllium oxide (BeO), ceramic, and a printed circuit board (PCB).

In addition, the body 410 includes a bottom portion and a wall portion to form the cavity, and the bottom and wall portions may be integrally formed by injection molding, etching or the like, but the formation method is not limited thereto. The inner surface of the wall portion may be provided with an inclined plane and, in particular, an angle between the side surface of the wall portion forming the cavity and the upper surface of the bottom portion may be greater than 90 degrees.

Meanwhile, the shape of the upper surface of the body 410 may be selected from a variety of shapes including triangle, rectangle, polygon and circle, and the shape thereof is not limited thereto.

The light emitting device 420 may be, for example, a color light emitting device to emit colored light such as red, green, blue or white light, or an ultraviolet (UV) light emitting device to emit ultraviolet light, although the type of the device is not limited thereto. In addition, a plurality of light emitting devices 420 may be mounted in the body 410.

The light emitting device 420 includes a notch or an island, thus blocking current concentration through dislocation when static electricity is applied and improving ESD resistance.

Meanwhile, as shown in FIGS. 1 to 3, the light emitting device 420 may be applied to a horizontal type in which all electric terminals are disposed on the upper surface thereof, or a vertical type in which electric terminals are disposed on the upper and lower surfaces thereof.

A case wherein the light emitting device 420 is disposed on the second electrode 532 and is bonded to the first electrode layer 431 and the second electrode layer 432 by wire bonding is illustrated in FIG. 4, the bonding method is not limited thereto, wire bonding and electrical connection using either flip chip or die bonding may be used.

The first electrode layer 431 and the second electrode layer 432 are electrically isolated from each other and supply power to the light emitting device 420. In addition, the first electrode layer 431 and the second electrode layer 432 reflect light generated from the light emitting device 420, thus increasing luminous efficacy and discharging heat generated by the light emitting device 420.

The first electrode layer 431 and the second electrode layer 432 contain at least metal of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), or an alloy thereof.

In addition, the first electrode layer 431 and the second electrode layer 432 may have a mono- or multilayer structure.

The sealant 440 fills the cavity such that it covers the light emitting device 420. The sealant 440 may be made of a material such as silicone, epoxy and other resins and may be formed by filling a material in the cavity, followed by curing using UV light or heat.

Meanwhile, the sealant 440 may include a phosphor 450. The type of the phosphor 450 is determined depending on the wavelength of light generated from the light emitting device 420, thus enabling the light emitting device package 400 to render white light.

In addition, the phosphor 450 may be disposed in the form of a conformal coating on the upper surface of the light emitting device 420 or the upper surface of the body 410.

The phosphor 450 is excited by first light emitted from the light emitting device 420 to produce second light. For example, when the light emitting device 420 is a blue light emitting device and the phosphor is a yellow phosphor, the yellow phosphor is excited by blue light and emits yellow light, and the blue light emitted by the blue light emitting device is mixed with yellow light excited and generated by blue light to allow the light emitting device package 400 to render white light.

Similarly, in the case where the light-emitting device 530 is a green light-emitting diode, the magenta phosphor or a combination of blue and red phosphors may be exemplified, and in the case where the light emitting device 420 is a red light-emitting diode, a cyan phosphor or a combination of blue and green phosphors may be exemplified.

Such a phosphor 450 may be a known phosphor such as YAG, TAG, sulfides, silicates, aluminates, nitrides, carbides, nitridosilicates, borates, fluorides and phosphates.

The light emitting device package 500 according to one embodiment is arrayed in plural on the substrate and an optical member such as light guide plate, prism sheet and diffusion sheet may be disposed on a light passage of the light emitting device package 400. The light emitting device package, the substrate and the optical member may serve as a light unit.

In another embodiment, a display device, an indicating device and a lighting device including the light emitting device or light emitting device package disclosed in the aforementioned embodiments may be realized. For example, the lighting device may include a lamp, a streetlamp, or the like.

In addition, the light emitting device according to the embodiments may be applied without limitation of configuration and method of the embodiments mentioned above and may be configured in a selective combination of the entirety or part of respective embodiments.

In addition, a vertical light emitting device may be formed by removing the substrate from the structure including the first conductive semiconductor layer, the active layer and the second conductive semiconductor layer and forming an electrode on the upper surface of the exposed first conductive semiconductor layer and the second conductive semiconductor layer.

Figure 5:
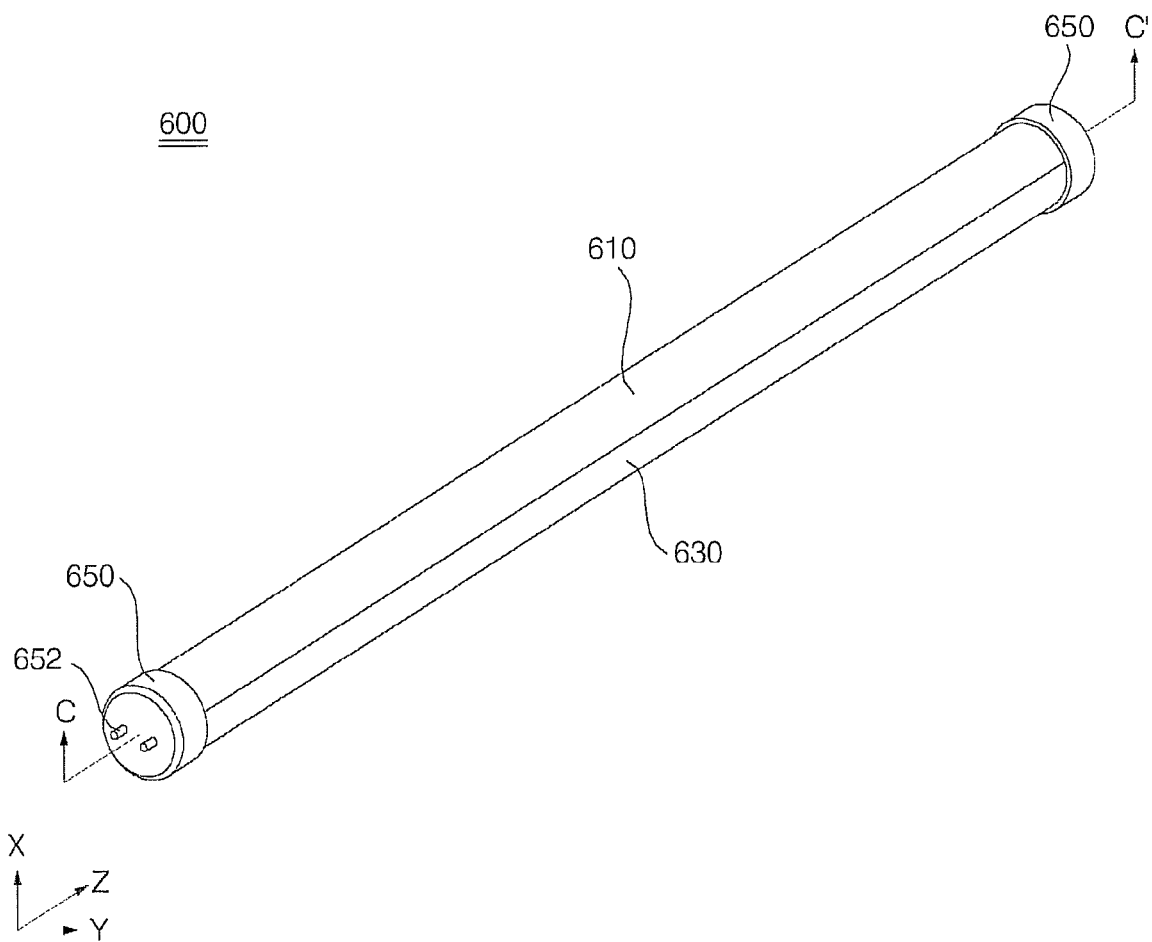
FIG. 5 is a perspective view illustrating a lighting device including the light emitting device according to one embodiment.
Figure 6:
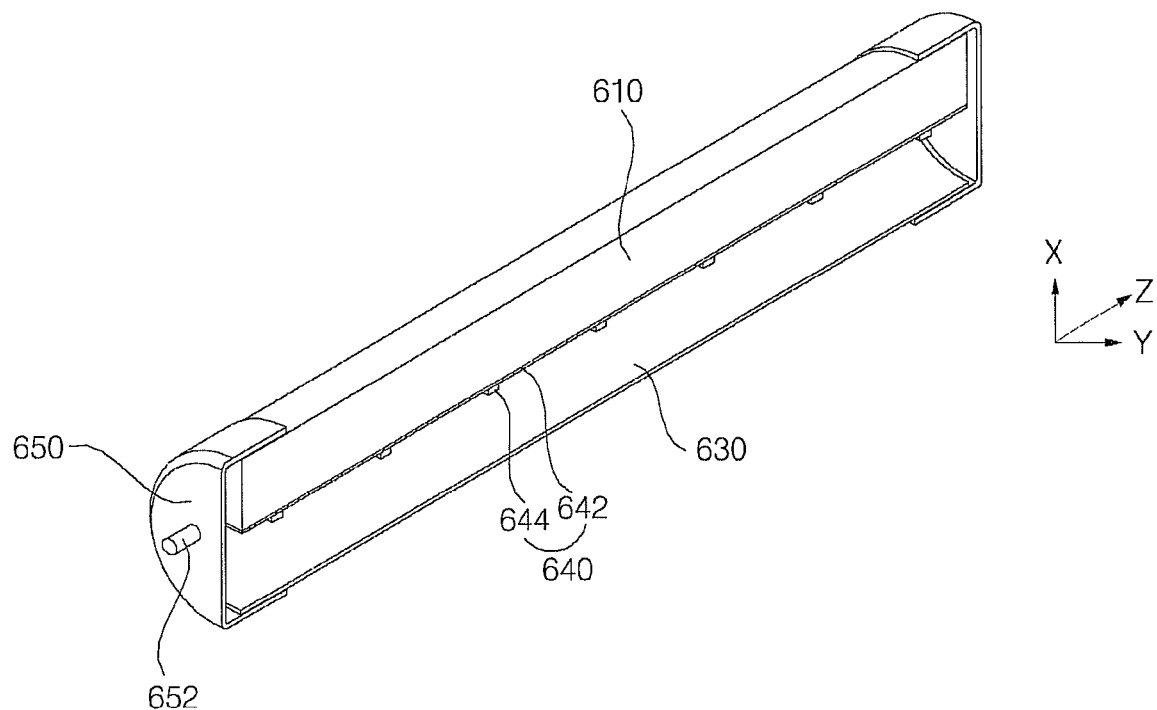
FIG. 6 is a sectional view illustrating the cross-section taken along the line of C-C' of the lighting device of FIG. 5.

FIG. 5 is a perspective view illustrating a lighting device including the light emitting device according to one embodiment. FIG. 6 is a sectional view illustrating the cross-section taken along the line of C-C' of the lighting device of FIG. 5.

Referring to FIGS. 5 and 6, the lighting device 600 may include a body 610, a cover 630 connected to the body 610 and an end cap 650 disposed at both ends of the body 610.

A light emitting device module 640 is connected to the upper surface of the body 610 and the body 610 may be composed of a metal material which exhibits superior conductivity and heat dissipation effects in order to discharge heat generated from the light emitting device package 644 to the outside through the top of the body 610.

The light emitting device packages 644 are mounted on the PCB 642 in multiple colors and multiple rows to constitute an array, and may be spaced from one another by a predetermined distance or by different distances, as necessary, to control brightness. The PCB 642 may be a metal core PCB (MPPCB) or PCB made of FR4.

The light emitting device package 644 includes an extended lead frame (not shown) to improve light irradiation and thus enhance reliability and efficiency of the light emitting device package 644, and extend the lifespan of the lighting device 600 including the light emitting device package 622 and the light emitting device package 644.

The cover 630 may take the shape of a circle to surround the bottom of the body 610, without being limited thereto.

The cover 630 protects the light emitting device module 640 from foreign substances. In addition, the cover 630 prevents glare generated from the light emitting device package 644 and includes diffusion particles to uniformly discharge light to the outside. In addition, a prism pattern or the like may be formed on at least one of the inner and outer surfaces of the cover 630. Alternatively, a phosphor may be applied to at least one of the inner and outer surfaces of the cover 630.

Meanwhile, the cover 630 should exhibit superior light transmittance, in order to discharge light generated from the light emitting device package 644 through the cover 630 to the outside, and the cover 630 should exhibit sufficient heat resistance in order to endure heat emitted by the light emitting device package 644. Preferably, the cover 630 is composed of a material including polyethylene terephthalate (PET), polycarbonate (PC), polymethyl methacrylate (PMMA) or the like.

The end cap 650 is disposed on both ends of the body 610 and may be used to seal a power supply device (not shown). In addition, the end cap 650 is provided with a power pin 652, allowing the lighting device 600 to be applied to a conventional terminal from which a fluorescent light has been removed, without using any additional device.

Figure 7:
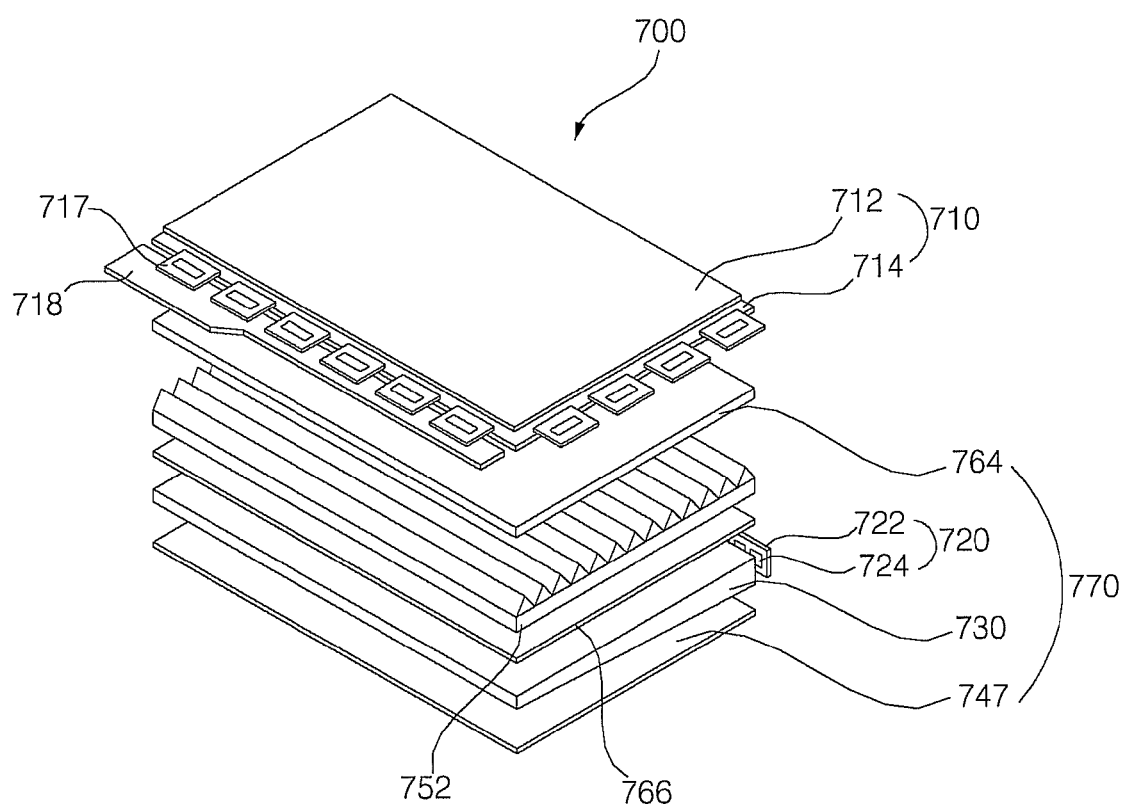
FIG. 7 is an exploded perspective view illustrating a liquid crystal display including the light emitting device according to one embodiment.

FIG. 7 is an exploded perspective view illustrating a liquid crystal display including the light emitting device according to one embodiment.

FIG. 7 illustrates an edge-light type liquid crystal display device 700 which includes a liquid crystal display panel 710 and a backlight unit 770 to supply light to the liquid crystal display panel 710.

The liquid crystal display panel 710 displays an image using light supplied from the backlight unit 770. The liquid crystal display panel 710 includes a color filter substrate 712 and a thin film transistor substrate 714 which face each other such that a liquid crystal is interposed therebetween.

The color filter substrate 712 can realize color of images to be displayed through the liquid crystal display panel 710.

The thin film transistor substrate 714 is electrically connected to a printed circuit board 718 on which a plurality of circuit components are mounted through a driving film 717. In responds to drive signals supplied from the printed circuit board 718, the thin film transistor substrate 714 may apply a drive voltage from the printed circuit board 718 to liquid crystals.

The thin film transistor substrate 714 includes a thin film transistor and a pixel electrode formed as a thin film on another substrate composed of a transparent material such as glass or plastic.

The backlight unit 770 includes a light emitting device module 720, a light guide plate 730 to convert light emitted from the light emitting device module 720 into surface light and supply the light to the liquid crystal display panel 710, a plurality of films 752, 766 and 764 to uniformize brightness of light from the light guide plate 730 and improve vertical incidence, and a reflective sheet 740 to reflect light emitted to the back of the light guide plate 730 to the light guide plate 730.

The light emitting device module 720 includes a plurality of light emitting device packages 724 and a PCB 722 on which the light emitting device packages 724 are mounted to form an array.

Meanwhile, the backlight unit 770 includes a diffusion film 766 to diffuse light incident from the light guide plate 730 toward the liquid crystal display panel 710, a prism film 752 to concentrate the diffused light and thus improve vertical incidence and a protective film 764 to protect the prism film 752.

Figure 8:
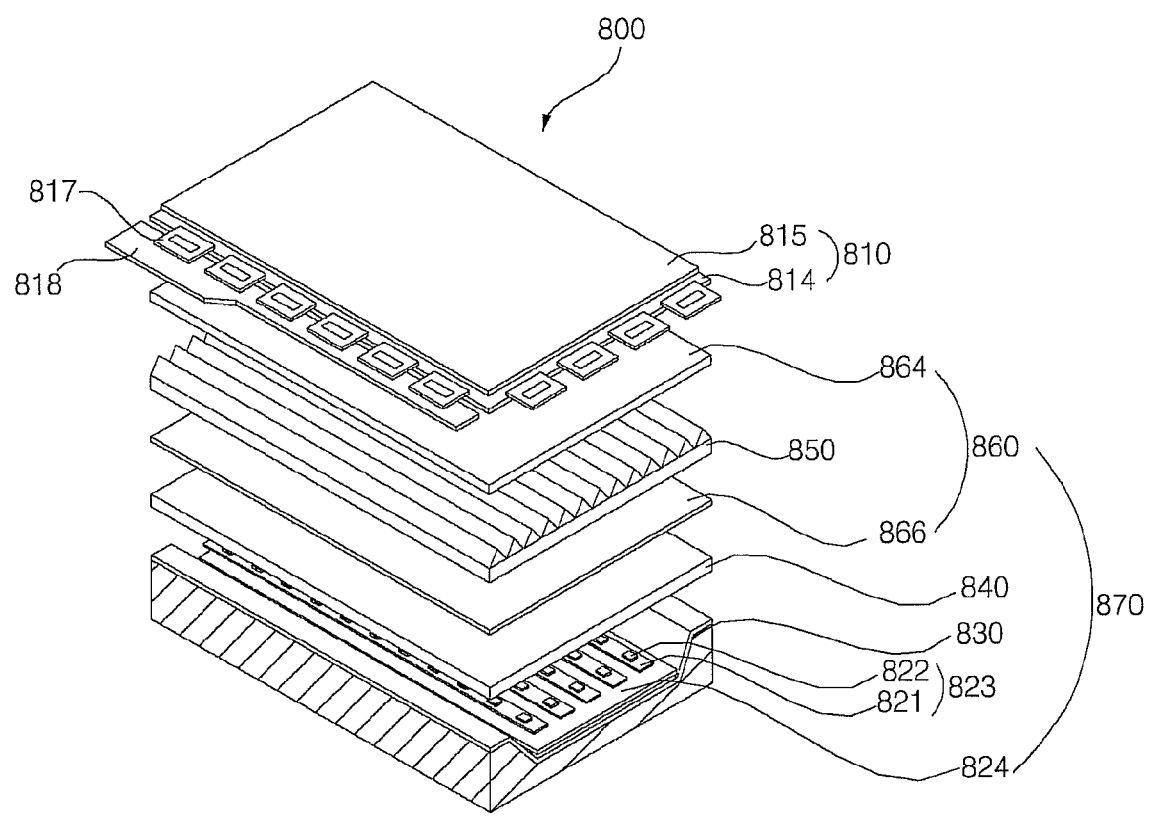
FIG. 8 is an exploded perspective view illustrating a liquid crystal display including the light emitting device according to one embodiment.

FIG. 8 is an exploded perspective view illustrating a liquid crystal display including the light emitting device according to one embodiment. The contents illustrated and described in FIG. 7 are not mentioned in detail.

FIG. 8 illustrates a direct-type liquid crystal display device 800 which includes a liquid crystal display panel 810 and a backlight unit 870 to supply light to the liquid crystal display panel 810.

The liquid crystal display panel 810 has been described with reference to FIG. 7 and a detailed explanation thereof is thus omitted.

The backlight unit 870 includes a plurality of light emitting device modules 823, a reflective sheet 824, a lower chassis 830 in which the light emitting device module 823 and the reflective sheet 824 are accepted, a diffusion plate 840 disposed on the light emitting device module 823, and a plurality of optical films 860.

The light emitting device module 823 includes a PCB 821 that enables a plurality of light emitting device packages 824 to be mounted and thereby to form an array.

The reflective sheet 824 reflects light generated by the light emitting device package 822 toward the liquid crystal display panel 810 to improve luminous efficacy.

Meanwhile, light emitted from the light emitting device module 823 is incident on the diffusion plate 840 and an optical film 860 is disposed on the diffusion plate 840. The optical film 860 includes a diffusion film 866, a prism film 850 and a protective film 864.

Embodiments can reduce leakage current due to dislocation and improve resistance to electrostatic discharge (ESD).

Although the embodiments have been disclosed for illustrative purposes, those skilled in the art will appreciate that various modifications, additions and substitutions are possible, without departing from the scope and spirit of the embodiments as disclosed in the accompanying claims. For example, the respective elements described in detail in the embodiments may be modified. Further, it will be understood that differences relating to these modifications, additions and substitutions are covered by the scope of the embodiments defined in the accompanying claims.

What is claimed is:

1. A light emitting device comprising:
a substrate;
a first conductive semiconductor layer disposed on the substrate;
an active layer disposed on the first conductive semiconductor layer; and
a second conductive semiconductor layer disposed on the active layer,
wherein the first conductive semiconductor layer comprises a first layer provided at an upper surface thereof with a notch, a second layer disposed on the first layer and a third layer disposed on the second layer,
wherein the first conductive semiconductor layer further comprises a blocking layer between the first layer and the second layer and the blocking layer is disposed along the notch, wherein a center of the notch overlaps at least a portion of a flat top surface of the third layer,
wherein a first electrode is disposed on the first layer and the first electrode electrically connected to the first layer, and wherein an opening of the notch is disposed above a contact surface of the first electrode and the first layer, and
wherein the second layer of the first conductive semiconductor layer has a flat upper surface and a bottom surface that has a prescribed shape to correspond to the notch on the upper surface of the first layer.

2. The light emitting device according to claim 1, wherein the blocking layer is an AlGaN/GaN superlattice layer.

3. The light emitting device according to claim 1, wherein the first layer and the third layer are doped with impurities.

4. The light emitting device according to claim 1, wherein the second layer comprises a silicon(Si).

5. The light emitting device according to claim 1, wherein the second layer is an un-doped.

6. The light emitting device according to claim 1, wherein the notch has a hexagonal pyramid or wedge shape.

7. The light emitting device according to claim 1, further comprising a light-transmitting electrode layer disposed on the second conductive semiconductor layer.

8. The light emitting device according to claim 1, further comprising:
a second electrode disposed on the second conductive semiconductor layer.

9. The light emitting device according to claim 1, further comprising a buffer layer disposed on the substrate.

10. The light emitting device according to claim 1, wherein a total thickness of the second layer and the third layer is 0.5-1 µm.

11. The light emitting device according to claim 1, wherein the notch is one of a plurality of notches provided on the upper surface of the first layer of the first conductive semiconductor layer, and a center of each of the plurality of notches overlaps at least a portion of a flat top surface of the third layer.

12. A light emitting device package comprising a body forming a cavity, a first electrode layer mounted on the body, a second electrode layer mounted on the body, and a light emitting device electrically connected to the first electrode layer and the second electrode layer, wherein the light emitting device comprises:
a substrate;
a first conductive semiconductor layer disposed on the substrate;
an active layer disposed on the first conductive semiconductor layer; and
a second conductive semiconductor layer disposed on the active layer,
wherein the first conductive semiconductor layer comprises a first layer provided at an upper surface thereof with a plurality of notches, a second layer disposed on the first layer and a third layer disposed on the second layer,
wherein the first conductive semiconductor layer further comprises a blocking layer between the first layer and the second layer and the blocking layer is disposed along the plurality of notches, wherein a center of each of the plurality of notches overlaps at least a portion of a flat top surface of the third layer,
wherein a first electrode is disposed on the first layer and the first electrode is electrically connected to the first layer, and wherein an opening of the plurality of notches is disposed above a contact surface of the first electrode and the first layer,
wherein the second layer of the first conductive semiconductor layer has a flat upper surface and a bottom surface that has a prescribed shape to correspond to the plurality of notches provided on the upper surface of the first layer.

13. The light emitting device package according to claim 12, further comprising a buffer layer disposed on the substrate.

14. The light emitting device package according to claim 12, wherein a total thickness of the second layer and the third layer is 0.5-1 µm.

15. The light emitting device package according to claim 12, wherein an intermediate layer is disposed between the active layer and the second conductive layer, and wherein the intermediate layer has a larger band gap than the active layer.

16. A lighting device comprising a body, a cover connected to the body and a light emitting device module comprising a light emitting device,
wherein the light emitting device module is connected to the upper surface of the body,
wherein the light emitting device comprises:
a substrate;
a first conductive semiconductor layer disposed on the substrate;
an active layer disposed on the first conductive semiconductor layer; and
a second conductive semiconductor layer disposed on the active layer,
wherein the first conductive semiconductor layer comprises a first layer provided at an upper surface thereof with a notch, a second layer disposed on the first layer and a third layer disposed on the second layer,
wherein the first conductive semiconductor layer further comprises a blocking layer between the first layer and the second layer and the blocking layer is disposed along the notch, wherein a center of the notch overlaps at least a portion of a flat top surface of the third layer,
wherein a first electrode is disposed on the first layer and the first electrode electrically connected to the first layer, and wherein an opening of the notch is disposed above a contact surface of the first electrode and the first layer, and
wherein the second layer of the first conductive semiconductor layer has a flat upper surface and a bottom surface that has a prescribed shape to correspond to the notch on the upper surface of the first layer.

17. The lighting device according to claim 16, wherein the notch is one of a plurality of notches provided on the upper surface of the first layer of the first conductive semiconductor layer, and a center of each of the plurality of notches overlaps at least a portion of a flat top surface of the third layer.

* * * * *